United States Patent [19]

Gakumura

[11] Patent Number: 5,132,799
[45] Date of Patent: Jul. 21, 1992

[54] FREQUENCY SYNTHESIZER-TYPE TELEVISION SIGNAL RECEIVING APPARATUS COMPRISING AFT FUNCTION AND CONTROLLING METHOD THEREFOR

[75] Inventor: Hiroki Gakumura, Higashiosaka, Japan

[73] Assignee: Sanyo Electric Co., Ltd., Japan

[21] Appl. No.: 604,543

[22] Filed: Oct. 29, 1990

[30] Foreign Application Priority Data

Oct. 30, 1989 [JP] Japan .................................. 1-283323

[51] Int. Cl.⁵ .............................................. H04N 5/50
[52] U.S. Cl. .............................. 358/191.1; 358/195.1; 358/193.1; 455/182.1; 455/192.1
[58] Field of Search .................. 358/195.1, 191.1, 188, 358/193.1; 455/182, 192, 183, 260, 75, 76

[56] References Cited

U.S. PATENT DOCUMENTS

| | | | |
|---|---|---|---|
| 3,949,158 | 4/1976 | Rzeszewski | 358/195.1 |
| 4,374,437 | 2/1983 | Citta | 455/182 |
| 4,855,835 | 8/1989 | Tobita | 358/195.1 |

FOREIGN PATENT DOCUMENTS 63-23715 5/1988 Japan .

Primary Examiner—Howard W. Britton
Assistant Examiner—Sherrie Hsia
Attorney, Agent, or Firm—Armstrong, Nikaido, Marmelstein, Kubovcik & Murray

[57] ABSTRACT

A PLL frquency synthesizer system television signal receiving apparatus includes a tuner, a control circuit for controlling a channel selecting operation by the tuner, and an intermediate frequency processing circuit for subjecting the IF signal outputted from the tuner to an intermediate frequency processing. The control circuit controls oscillating frequency of a local oscillating circuit in the tuner based on the PLL frequency synthesizer system. The intermediate frequency processing circuit includes an AFT signal detecting circuit for detecting a deviation of the IF signal frequency from the standard carrier frequency and feeding back the same to the control circuit. The AFT signal detecting circuit has an AFT coil which radiates higher harmonics. After a channel selection by the control circuit is completed, the AFT signal detecting circuit is rendered non-operative, so that beat interference appearing on a reproduced picture caused by the higher harmonics from the AFT coil are prevented.

2 Claims, 7 Drawing Sheets

FROM CHANNEL
SELECTION
CONTROL
CIRCUIT 4

FREQUENCY SYNTHESIZER-TYPE TELEVISION SIGNAL RECEIVING APPARATUS COMPRISING AFT FUNCTION AND CONTROLLING METHOD THEREFOR

BACKGROUND OF THE INVENTION

1. Field of the Invention

The present invention relates generally to frequency synthesizer-type television signal receiving apparatus and controlling methods therefor and, more particularly, to a frequency synthesizer-type television signal receiving apparatus for use in a television set, video cassette recorder (VCR) or the like, which utilizes an AFT (Automatic Fine Tuning) signal detecting circuit for channel selection, and controlling method of such AFT signal detecting circuit.

2. Description of the Background Art

Voltage synthesizer system and PLL frequency synthesizer system are well known as a television signal receiving apparatus for use in a conventional television set or a VCR, which converts a signal of a desired channel among received RF television signals into an intermediate frequency (IF) signal by means of a tuner.

FIG. 1 is a schematic block diagram showing a conventional television signal receiving apparatus of such a voltage synthesizer system as described above. Referring to FIG. 1, the RF television signals received by an antenna 1 is applied a tuner 2 mainly comprising a mixing circuit 2a and a local oscillating circuit 2b. The RF television signals applied to tuner 2 are mixed in mixing circuit 2a with the local oscillating signal from local oscillating circuit 2b. The local oscillating frequency of local oscillating circuit 2b is controlled by a control voltage applied from a control circuit 3. Control circuit 3 changes its control voltage in response to a control signal generated from a channel selection control circuit 4 based on channel selection operation by a user. Namely, a local oscillating output of the local oscillating frequency predetermined so as to correspond to a channel desired by the user is mixed with the RF television signal of that channel in mixing circuit 2a and the mixture is extracted as an IF signal.

In this way, the IF signal extracted from tuner 2, after having the band thereof limited by a SAW filter 5, is applied to an intermediate frequency processing circuit 6 comprising ICs. Intermediate frequency processing circuit 6 mainly comprises a video detecting circuit 6a and an AFT signal detecting circuit 6b. The IF signal applied to intermediate frequency processing circuit 6 is video-detected by the well known video detecting circuit 6a and the video-detected signal is supplied as a color video signal through a terminal 7. The supplied color video signal is applied to a picture tube (not shown) through a video amplifying circuit (not shown), for example.

It sometimes happens that the local oscillating frequency of local oscillating circuit 2b in tuner 2 fluctuates due to temperature drift or the like and consequently the actual local oscillating frequency deviates from the correct oscillating frequency predetermined for each channel. Such deviation of the local oscillating frequency causes a deviation of the IF signal frequency of the desired channel, resulting in deterioration of quality of the reproduced picture.

As a method of compensating such deviation in a local oscillating frequency, widely known is feed-back control using a so-called AFT loop. More specifically, referring to FIG. 1, the IF signal applied to intermediate frequency processing circuit 6 is applied to both video detecting circuit 6a and AFT signal detecting circuit 6b. As will be described later in detail, the AFT signal detecting circuit 6b comprises a double-balanced differential amplifier to generate an AFT signal having a signal voltage corresponding to such fluctuation in the IF signal frequency as described above and feed back the same to control circuit 3. In response to the AFT signal, control circuit 3 adjusts the control voltage to be applied to local oscillating circuit 2b to correct the local oscillating frequency of local oscillating circuit 2b so as to compensate the fluctuation in the IF signal frequency.

Meanwhile, in the television signal receiving apparatus shown in FIG. 1, AFT signal detecting circuit 6b might generate an erroneous AFT signal and apply the same to control circuit 3 due to unstable operation of the entire receiving apparatus immediately after the channel selection, that is, channel switching. Thus, the conventional voltage synthesizer system television signal receiving apparatus is structured such that an AFT signal detecting circuit of FIG. 1 is rendered non-operative (muted) during and before and after the channel selection.

FIG. 2 is a schematic block diagram showing the conventional television signal receiving apparatus of a PLL frequency synthesizer system. The television signal receiving apparatus shown in FIG. 2 is the same as that shown in FIG. 1 except the following points.

Namely, control circuit 3 comprises a 1/n frequency dividing circuit 3a, a reference signal generating circuit 3b and a phase comparing circuit 3c. The local oscillating signal from local oscillating circuit 2b is applied to frequency dividing circuit 3a wherein the signal frequency is divided by n, so that the frequency divided signal is applied to one input of phase comparing circuit 3c. The other input of phase comparing circuit 3c receives a reference signal of a fixed frequency from reference signal generating circuit 3b. Phase comparing circuit 3c compares the phases of both inputs to output an error signal to be applied as a control voltage to local oscillating circuit 2b of tuner 2. Namely, dividing circuit 3a, phase comparing circuit 3c and local oscillating circuit 2b constitute a phase locked loop (PLL). When selecting channels, channel selection control circuit 4 comprising a microcomputer changes the frequency dividing ratio 1/n of frequency dividing circuit 3a in accordance with the channel to be selected. As a result, the control voltage outputted from phase comparing circuit 3c is changed, so that the local oscillating frequency of local oscillating circuit 2b is also changed to carry out channel selection.

In principle, the PLL frequency synthesizer system television signal receiving apparatus shown in FIG. 2 does not require a provision of such AFT signal detecting circuit as shown in FIG. 1 because of highly precise control of the local oscillating frequency by using the microcomputer.

In a specific case, however, an AFT signal detecting circuit is provided in the PLL frequency synthesizer system television signal receiving apparatus. For example, in receiving apparatus capable of receiving such cable broadcasting signal as CATV in addition to an ordinary television broadcasting signal, since a broadcasting (carrier) frequency for the CATV is intentionally deviated from the ordinary television broadcasting (carrier) frequency by a fixed frequency, a local oscillating frequency of a tuner needs to be deviated correspondingly to the above described deviation when selecting channels for the CATV. More specifically, when the AFT signal detecting circuit detects the above-described fixed deviation of the IF signal frequency, the channel selection control circuit microcomputer makes the determination that the channel for CATV broadcasting is selected. As the foregoing, the PLL frequency synthesizer system television signal receiving apparatus utilizing an AFT signal detecting circuit for channel selection for the CATV broadcasting is disclosed in U.S. Pat. No. 4,426,734, for example.

FIG. 3 is a block diagram showing one example of such a PLL frequency synthesizer system television signal receiving apparatus. The television signal receiving apparatus shown in FIG. 3 is the same as that shown in FIG. 2 except the following points. Namely, intermediate frequency processing circuit 6 includes an AFT signal detecting circuit 6b in addition to video detecting circuit 6a.

Described in more detail, the IF signal supplied from SAW filter 5 is inputted to intermediate frequency processing circuit 6 formed as an IC and first amplified by an intermediate frequency signal amplifying circuit 6c and then applied to a carrier extracting circuit 6d and a video detecting circuit 6a. Carrier extracting circuit 6d having an externally attached detecting coil 6g extracts a carrier signal component of 45.75MHz from the IF signal and applies the same to video detecting circuit 6a and AFT signal detecting circuit 6b. When extracting the carrier signal, a signal radio wave having the carrier frequency of 45.75MHz is intensively radiated from coil 6g.

Video detecting circuit 6a video-detects the carrier signal component applied from carrier extracting circuit 6b and the output of the circuit is supplied from intermediate frequency processing circuit 6 through a LPF 6e. Meanwhile, AFT signal detecting circuit 6b having an externally attached AFT detecting coil 6h generates an AFT signal in response to the carrier signal component applied from carrier extracting circuit 6d. FIG. 4 is a circuit diagram showing the AFT signal detecting circuit 6b in detail.

Referring to FIG. 4, the carrier signal component of 45.75MHz supplied from carrier extracting circuit 6d is inputted to AFT signal detecting circuit 6b through terminals 13 and 14. The AFT signal detecting circuit 6b is basically a double-balanced multiplier comprising transistors $Q_1$–$Q_6$ for multiplying the signal inputted from terminals 13 and 14 by the detection signal from the externally attached AFT detecting coil 6h. The result thereof is outputted from an output terminal 15 and applied to a LPF 6f (FIG. 3). Meanwhile, the reference numeral "12" in FIG. 4 denotes a biasing voltage source.

AFT detecting coil 6h generates the detection signal out of phase by 90° with respect to the carrier signal component of 45.75MHz applied to input terminals 13 and 14, when externally receiving the signal radio wave of 45.75MHz. The above described double-balanced multiplier generates the AFT signal of Vcc/2 and outputs the same through terminal 15 when receiving the signals of 45.75MHz out of phase by 90° from each other. Assuming now that an IF signal for CATV broadcasting having the carrier frequency of 42MHz deviated by 3.75MHz from the above-described carrier frequency of 45.75MHz, for example, is inputted to intermediate frequency processing circuit 6, coil 6g radiates a signal having a frequency of 42MHz to some intensity, less than the intensity for the above-described carrier of 45.75MHz, though. The radiated signal of 42MHz is received by AFT detecting coil 6h. The signal radio wave received by AFT detecting coil 6h is deviated from the above described 45.75MHz, so that the phase deviation between the inputs to the double-balanced multiplier is changed from the above-described 90°, corresponding to the deviation. In accordance with the 3.75MHz predetermined deviation width, the double-balanced multiplier generates a voltage which is outputted as an AFT signal through terminal 15. The output is supplied from intermediate frequency processing circuit 6 through LPF 6f of FIG. 3 and fed back to channel selection control circuit 4. The channel selection control circuit 4 receives the AFT signal to carry out the channel selection of changing the frequency-dividing ratio 1/n of frequency dividing circuit 3a until the signal attains a predetermined voltage corresponding to the predetermined deviation of the frequency for the CATV broadcasting.

As the foregoing, AFT signal detecting circuit 6b comprising the double-balanced multiplier generates higher harmonics having a fundamental frequency of an intermediate frequency due to the non-linear characteristic, so that IC 6 is filled with the higher harmonics. The higher harmonics are externally irradiated intensively from coils 6g and 6h to be fed back to antenna 1. When some of such higher harmonics are included in the band of the received channel, various beat interferences such as oblique stripes and wavy patterns appear on the reproduced picture in different manners for each channel.

In order to prevent such beat interference, the entire intermediate frequency processing circuit 6 formed as an IC is conventionally contained in a shield case to cut off the feed-back of the higher harmonics to the antenna, which shielding significantly deteriorates efficiency in manufacturing.

Meanwhile, Japanese Patent Publication No. 63-23715 discloses a frequency synthesizer system television signal receiving apparatus for stopping an AFT operation by cutting off the supply of an AFT signal from an AFT signal detecting circuit to a channel selection control circuit, if required. In this device, however, since the AFT signal detecting circuit itself operates all the time, such problem of radiation of higher harmonics as described above can not be resolved.

SUMMARY OF THE INVENTION

Therefore, an object of the present invention is to provide a PLL frequency synthesizer system television signal receiving apparatus allowing prevention of beat interference caused by higher harmonics radiated from an AFT detection coil of an AFT signal detecting circuit.

Another object of the present invention is to provide a control method of an AFT signal detecting circuit allowing prevention of beat interference caused by higher harmonics radiated from an AFT detection coil of an AFT signal detecting circuit.

Briefly stated, the present invention is a television signal receiving apparatus including a device for receiving RF television signals, a channel selecting device for designating a desired channel, a signal converting circuit for converting an RF television signal corresponding to the desired channel to an IF signal based on a PLL frequency synthesizer system, and an intermediate frequency processing circuit for subjecting an intermediate frequency processing to the IF signal. The intermediate frequency processing circuit includes an AFT signal detecting circuit for generating an AFT signal corresponding to a deviation of the IF signal frequency from the standard carrier frequency and feeding back the same to the signal converting circuit. The operation of the AFT signal detecting circuit is stopped after the detection of an IF signal frequency corresponding to the designated channel by the AFT signal converting circuit.

Therefore, the principal object of the present invention is to prevent radiation of higher harmonics from the AFT detection coil, thereby preventing beat interference appearing on the reproduced picture, by stopping the operation of the AFT signal detecting circuit itself when the television signal receiving apparatus is in a normal reception state.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
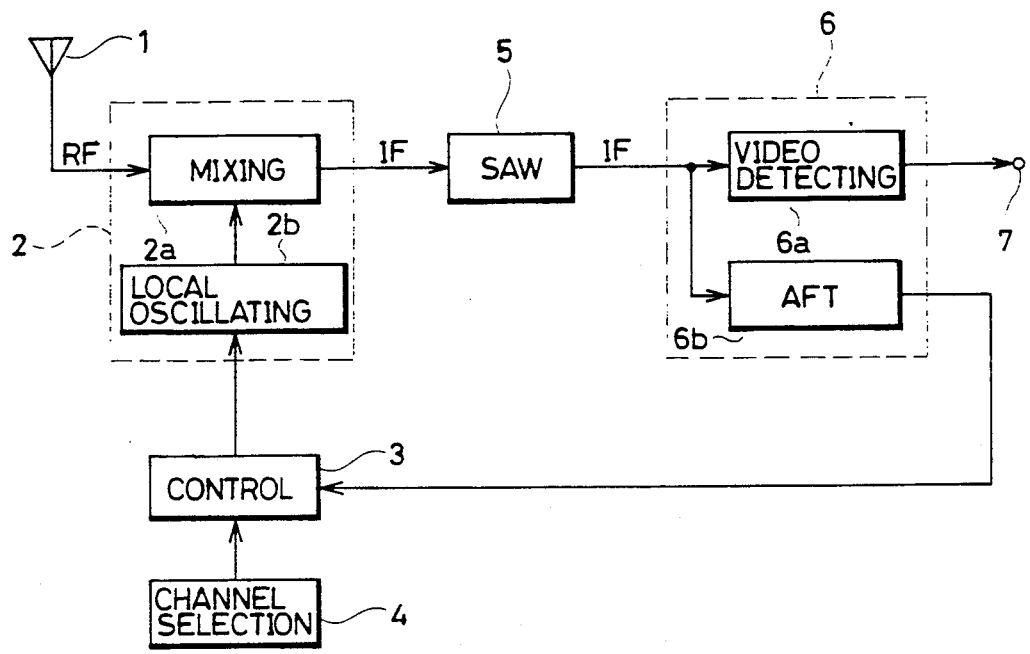
FIG. 1 is a schematic block diagram showing a conventional television signal receiving apparatus based on a voltage synthesizer system.
Figure 2:
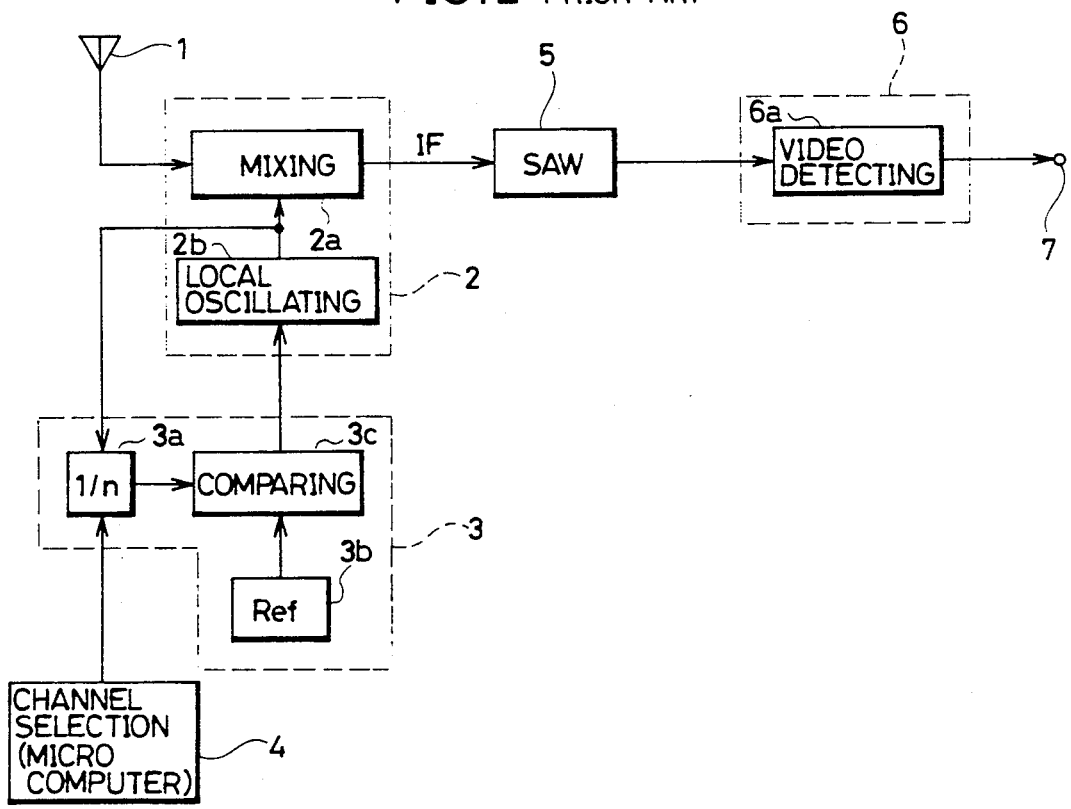
FIG. 2 is a schematic block diagram showing a conventional television signal receiving apparatus based on a PLL frequency synthesizer system.
Figure 3:
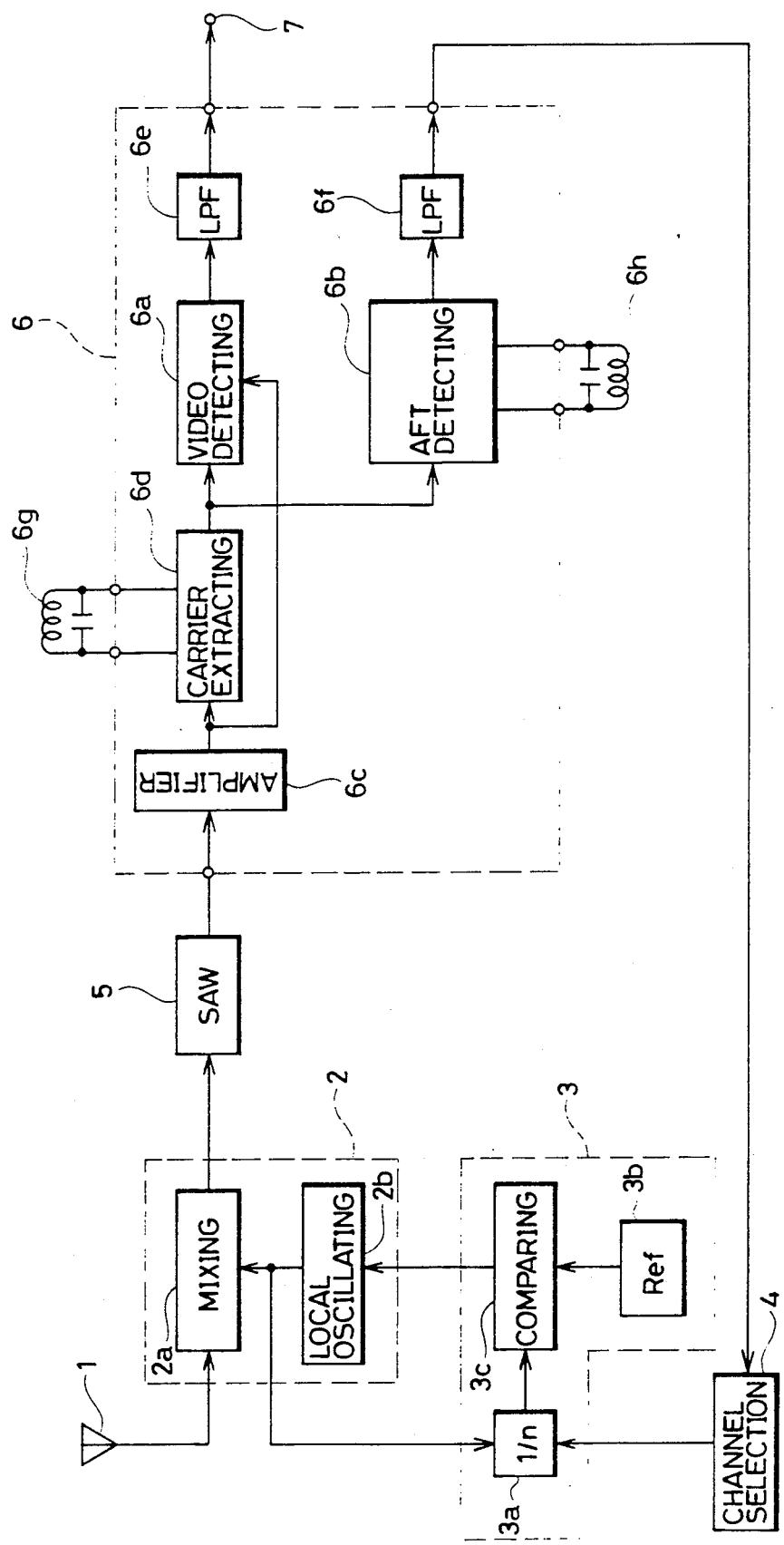
FIG. 3 is a schematic block diagram showing a television signal receiving apparatus comprising an AFT signal detecting circuit based on the PLL frequency synthesizer system.
Figure 4:
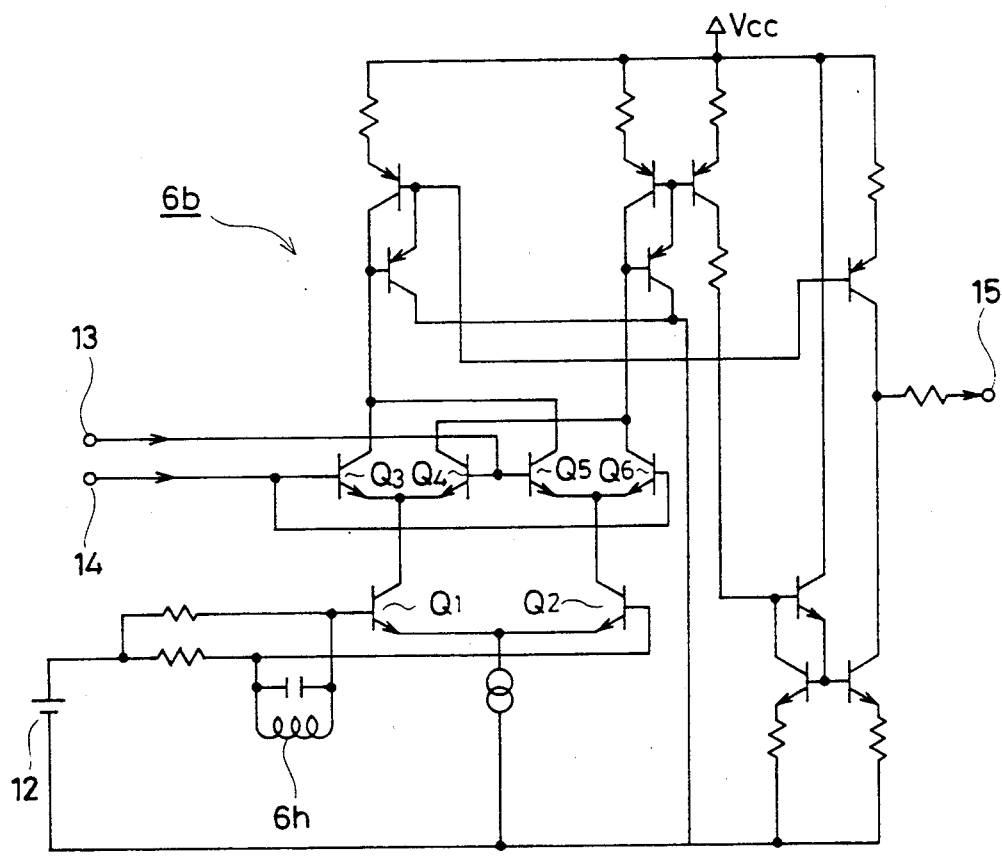
FIG. 4 is a circuit diagram showing the AFT signal detecting circuit in detail.
Figure 5:
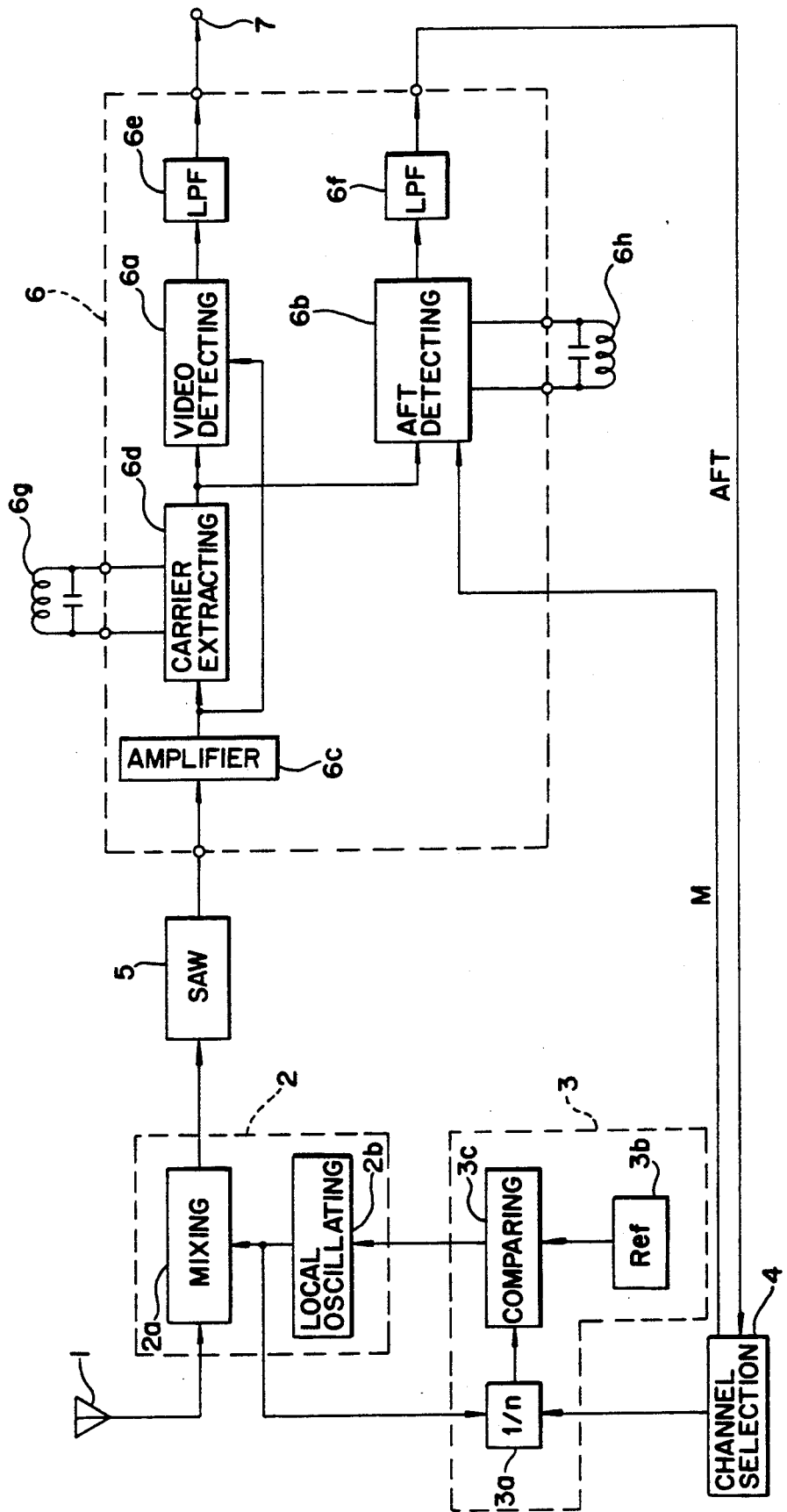
FIG. 5 is a schematic block diagram of the PLL frequency synthesizer system television signal receiving apparatus according to one embodiment of the present invention.
Figure 6:
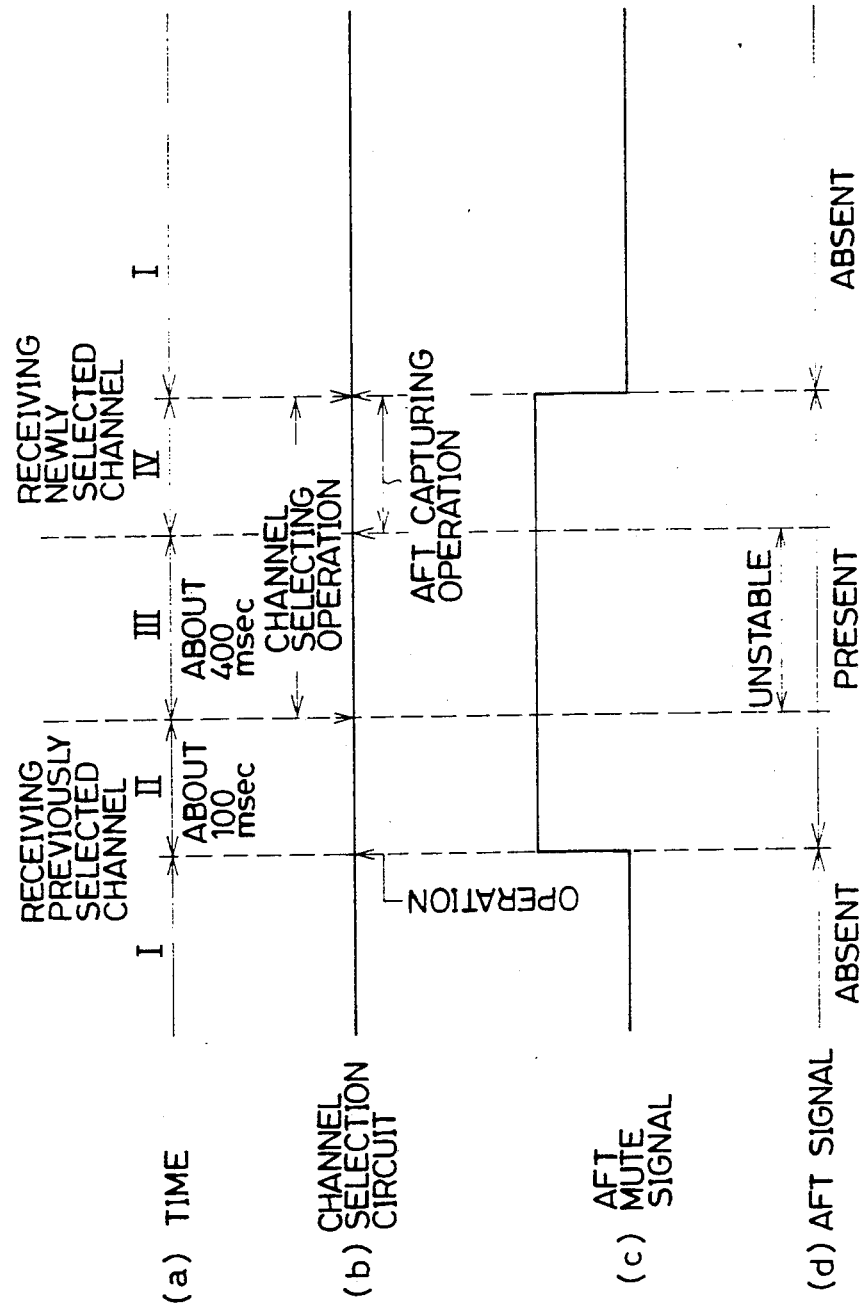
FIG. 6 is a timing chart explaining the operation of the embodiment shown in FIG. 5.

FIG. 5 is the schematic block diagram showing the PLL frequency synthesizer system television signal receiving apparatus according to one embodiment of the present invention and FIG. 6 is the timing chart explaining the operation thereof. The PLL frequency synthesizer system television signal receiving apparatus shown in FIG. 5 is the same as the conventional television signal receiving apparatus shown in FIG. 3 except the following point. Namely, an AFT mute signal M is applied from channel selection control circuit 4 formed by a microcomputer to AFT signal detecting circuit 6b. The timing of the AFT mute signal as controlled by the microcomputer is shown in FIG. 6 (c). When the AFT mute signal, is at a "H" (logical high) level, AFT signal detecting circuit 6b operates to detect an AFT signal. Meanwhile, when the AFT mute signal M is at a "L" (logical low) level, AFT signal detecting circuit 6b becomes non-operative (muted) to stop the detection of the AFT signal.

Referring to FIGS. 5 and 6, the operations of one embodiment of the present invention will be described.

In the period "I" (FIG. 6 (a)), the television signal receiving apparatus is in a normal reception state wherein the AFT mute signal supplied from channel selection control circuit 4 is at a "L" level (FIG. 6 (c)). Namely, in the normal reception state, AFT signal detecting circuit 6b does not operate and no AFT signal is supplied accordingly (FIG. 6 (d)). In addition, AFT detection coil 6h radiates no higher harmonic.

In the period "II" (FIG. 6 (a)), when the user operates a switch (not shown) for channel switching (FIG. 6 (b)), channel selection control circuit 4 microcomputer supplies an AFT mute signal of a "H" level (FIG. 6 (c)) to render AFT signal detecting circuit 6b operative. As a result, AFT signal detecting circuit starts supplying an AFT signal (FIG. 6 (d)). Several tens to hundreds m seconds is sufficient for AFT signal detecting circuit 6b to return to a normal operation state.

In the period "III" (FIG. 6 (a)), channel selection control circuit 4 changes the frequency-dividing ratio 1/n of frequency-dividing circuit 3a, thereby performing the channel selecting operation of changing the selection voltage to be applied to local oscillating circuit 2b (FIG. 6 (b)) in order to receive the broadcasting of the channel designated by the user. About 400 m seconds is sufficient for this channel selection voltage to become stable as a channel selection voltage for receiving a newly selected channel. During the channel selection, while AFT signal detecting circuit 6b remains in the normal operation state, the AFT signal is unstable due to the channel switching operation.

In the period "IV" (FIG. 6 (a)), the stable channel selection voltage causes the AFT signal to be stable. Then, channel selection control circuit 4 receives the AFT signal from AFT signal detecting circuit 6b to carry out the AFT capturing operation. Then, the channel selection control circuit 4 corrects the frequency dividing ratio 1/n of frequency dividing circuit 3a to correct the local oscillating frequency based on a predetermined deviation of a frequency for CATV broadcasting or the like. Such correction is kept performing until the predetermined deviation for reception of the CATV broadcast of the frequency is detected.

In the period "I" (FIG. 6 (a)), no AFT signal is required since the channel selecting operation is completed. Then, channel selection control circuit 4 sets the AFT mute signal to a "L" level (FIG. 6 (c)), thereby rendering AFT signal detecting circuit 6b non-operative again. Then, the normal television signal reception state continues hereinafter.

With respect to the beat interference caused by IF higher harmonics in the above described embodiment, in the period "II" immediately before the channel selecting operation and in the periods "III" and "IV" during the channel selecting operation, AFT signal detecting circuit 6b is operative and radiates the higher harmonics from AFT detection coil 6h, thereby causing the beat interference. However, the period "II" has a negligible length of about 100 m seconds, and the image is deteriorated originally due to the channel switching in the channel selecting operation periods "III" and, "IV" and therefore actually no beat interference occurs. In the period "I" in the normal reception state, AFT detection coil 6h radiates no higher harmonic and consequently only the detection coil 6h radiates higher harmonics in intermediate frequency processing circuit 6, thereby more significantly improving the beat interference than in the conventional television signal receiving apparatus.

Figure 7:
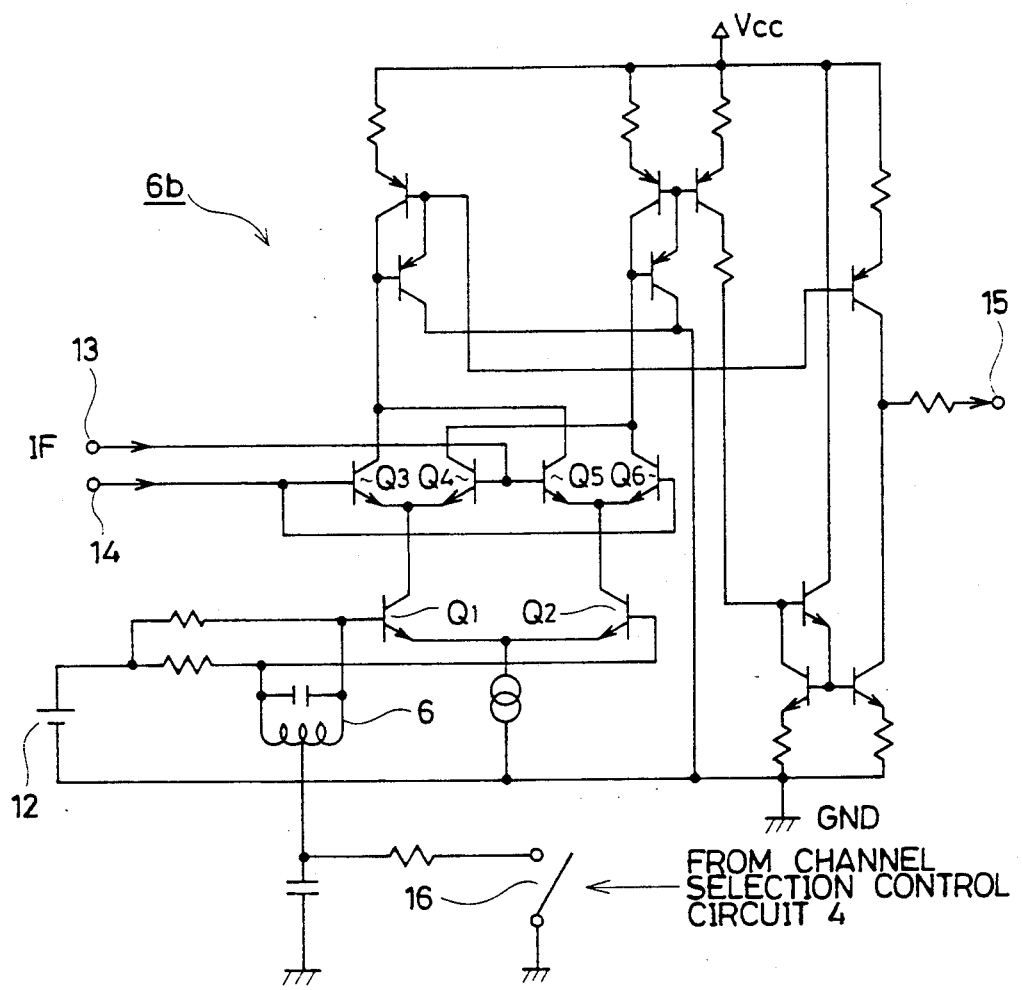
FIG. 7 is a circuit diagram showing one example of the AFT signal detecting circuit shown in FIG. 5.
Figure 8:
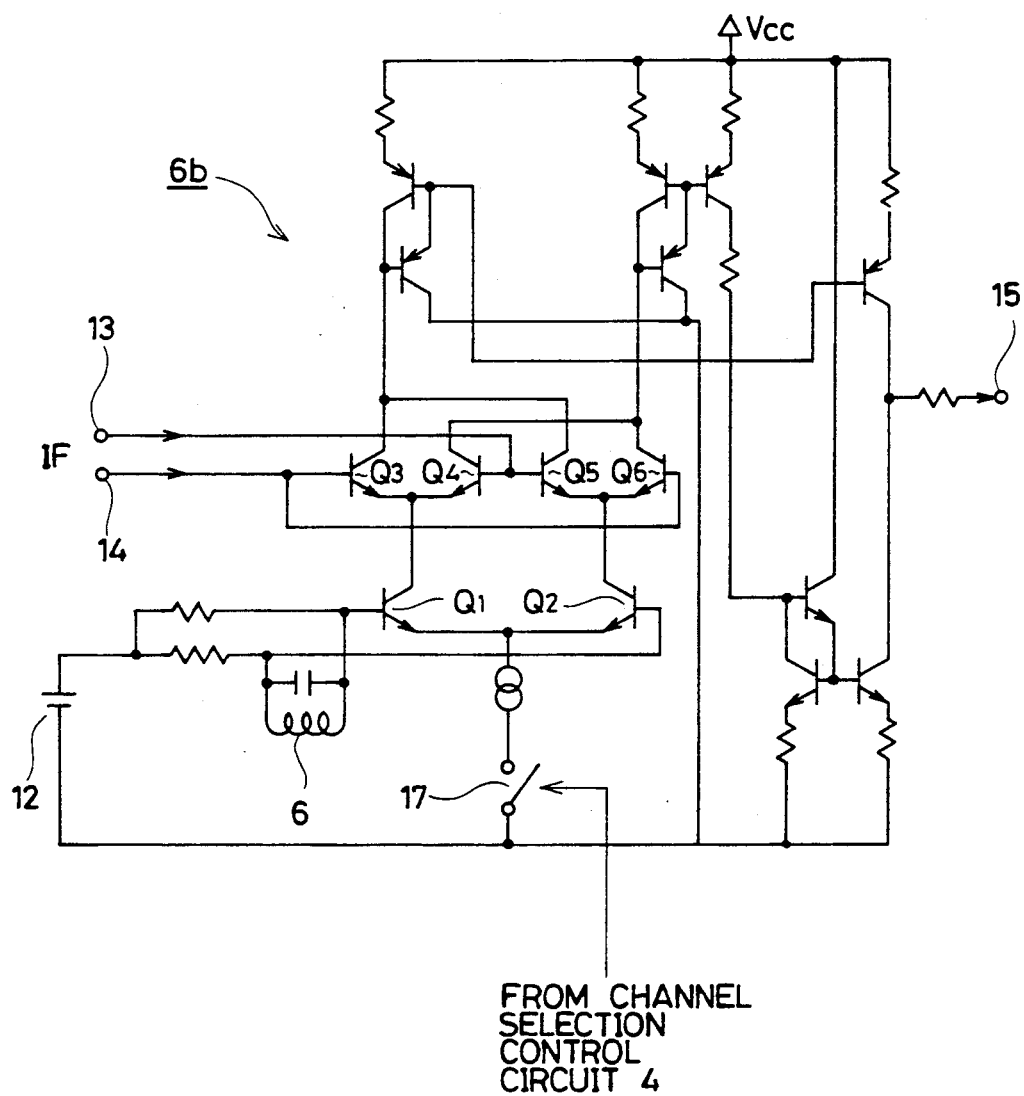
FIG. 8 is a circuit diagram showing another example of the AFT signal detecting circuit shown in FIG. 5.

In order to mute the AFT signal detecting circuit 6b in response to the AFT mute signal, AFT signal detecting circuit 6b is structured as shown in FIG. 7 or FIG. 8, for example. In FIG. 7, the AFT mute signal M from channel selection control circuit 4 is applied as a control signal to a mute switch 16. Namely, if it is structured such that mute switch 16 is turned on when the AFT mute signal is at a "L" level, transistors Q1 and Q2 of FIG. 7 are cut off in the normal reception state (the period "I" of FIG. 6), thereby stopping the operation of AFT signal detecting circuit 6b. Meanwhile in FIG. 8, the AFT mute signal M from channel selection control circuit 4 is applied as a control signal to a mute switch 17. Namely, if it is structured such that mute switch 17 is turned off when the AFT mute signal is at a "L" level, AFT signal detecting circuit 6b stops operating in the normal operation state (the period "I" of FIG. 6).

In the above described embodiment, the circuit arrangement is simplified by using a sound mute signal for erasing a sound noise signal generated at the switching of channels as an AFT mute signal. However, the AFT mute signal can be additionally generated, and in this case, the channel selecting operation by using the AFT loop can be satisfactorily carried out with any signal rendering the AFT signal detecting circuit operative at least for the AFT capturing period "IV" and for several tens m seconds immediately before that.

The method of rendering the AFT signal detecting circuit non-operative is not limited to those shown in FIGS. 7 and 8 and various methods can be employed.

As the foregoing, according to one embodiment of the present invention, by stopping the operation of the AFT signal detecting circuit itself in the normal reception state, the radiation of the higher harmonics from the AFT coil can be prevented to reduce the beat interference appearing on the reproduced picture.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase locked loop (PLL) synthesizer system television receiving apparatus comprising:
   means (1) for receiving radio frequency (FR) television signals;
   channel selection means (4) for designating a desired channel to be received;
   signal converting means (2,3) controlled by said channel selection means (4) for converting a received RF television signal corresponding to a designated channel to an intermediate frequency (IF) signal of a standard carrier frequency, said converting means including a PLL frequency synthesizer circuit (3);
   IF signal processing means (6) for processing an IF signal from said signal converting means, said IF signal processing means including automatic fine tuning (AFT) signal detecting means for generating an AFT voltage signal corresponding to a deviation of an IF signal frequency from the standard carrier frequency;
   said IF signal processing means further including a carrier extracting circuit and video detecting circuit for producing a video signal to be applied to a picture tube, said carrier extracting circuit and said AFT signal detecting means each including signal radiating means which may irradiate higher harmonics of signals therein, such harmonics causing beat interferences in a picture produced on said picture tube by said video signal;
   said AFT signal detecting means being connected to said channel selection means for feeding said AFT voltage signal to said signal converting means to adjust said IF signal frequency;
   means in said channel selecting means for generating an AFT mute signal; and
   means in said channel selection means for detecting from said AFT voltage signal when the PLL frequency synthesizer circuit has reached a frequency corresponding to the designated channel such that channel selection is completed, including means to thereupon connecting said AFT mute signal to said IF signal processing means for stopping operation of said AFT signal detecting means such that said high harmonics are not thereafter radiated.

2. In a PLL frequency synthesizer system television receiving apparatus comprising means for receiving RF television signals, channel selection means for designating a desired channel to be received, signal converting means connected to said channel selection means for converting an RF television signal to an IF signal by means of a PLL frequency synthesis system, and IF processing means connected to said signal converting means including means for producing a video signal from an IF signal frequency of standard carrier frequency to be applied to a picture tube and AFT signal detecting means for generating an AFT signal corresponding to a deviation of said IF signal frequency from said standard carrier frequency, said AFT signal detecting means being connected to said signal converting means, the method of controlling operation of said AFT signal detecting means comprising the steps of:
   (a) initiating operation of said AFT signal detecting means in response to operation of said channel selection means to designate a desired channel;
   (b) detecting changes in said IF signal frequency by said AFT signal detecting means; and
   (c) stopping operations of said AFT signal detecting means by feeding thereto an AFT mute signal generated by said channel selection means when the IF signal frequency resulting from change of frequency of said PLL frequency synthesis system reaches said standard carrier frequency, thereby preventing said AFT signal detecting means from radiating signals of higher harmonics that cause beat interferences with said standard carrier frequency signal applied to said picture tube.

* * * * *